(12) United States Patent
Kim et al.

(10) Patent No.: US 8,450,773 B1
(45) Date of Patent: May 28, 2013

(54) STRAIN-COMPENSATED INFRARED PHOTODETECTOR AND PHOTODETECTOR ARRAY

(75) Inventors: Jin K. Kim, Albuquerque, NM (US); Samuel D. Hawkins, Albuquerque, NM (US); John F. Klem, Albuquerque, NM (US); Michael J. Cich, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 344 days.

(21) Appl. No.: 12/836,769

(22) Filed: Jul. 15, 2010

(51) Int. Cl.
*H01L 31/0304* (2006.01)

(52) U.S. Cl.
USPC ...... 257/184; 257/22; 257/189; 257/E31.019; 250/338.4

(58) Field of Classification Search
USPC ................ 257/18, 21, 22, 184, 189, E31.019, 257/E31.021; 250/338.4
See application file for complete search history.

(56) References Cited

U.S. PATENT DOCUMENTS

| | | | |
|---|---|---|---|
| 6,229,152 B1 * | 5/2001 | Dries et al. | 257/17 |
| 6,452,242 B1 * | 9/2002 | Razeghi | 257/440 |
| 7,687,871 B2 | 3/2010 | Maimon | |
| 7,737,411 B2 | 6/2010 | Gunapala et al. | |
| 8,217,480 B2 * | 7/2012 | Ting et al. | 257/431 |
| 2008/0111152 A1 | 5/2008 | Scott et al. | |
| 2009/0256231 A1 | 10/2009 | Klipstein | |
| 2010/0072514 A1 | 3/2010 | Ting et al. | |
| 2010/0155777 A1 | 6/2010 | Hill et al. | |
| 2011/0037097 A1 * | 2/2011 | Scott et al. | 257/184 |

OTHER PUBLICATIONS

S. Maimon, et al., nBn detector, an infared detector with reduced dark current and higher operating temperature, 2006 American Institute of Physics, Applied Physics Letters 89, 151109 (2006).
G. W. Wicks et al, Infrared detector dpitaxial designs for suppression of surface leakage current, Proc. of SPIE vol. 7608 760822-1, http://spiedl.org/terms, (2010).
G. R. Savich, et al, Suppression of surface leakage currents using molecular beam epitaxy-grown unipolar barriers, 2010 American Vacuum Society. C3h18 J. Vac. Sci. Technol. B 28(3). May/Jun. 2010.

* cited by examiner

*Primary Examiner* — Tuan N. Quach
(74) *Attorney, Agent, or Firm* — Martin I. Finston

(57) ABSTRACT

A photodetector is disclosed for the detection of infrared light with a long cutoff wavelength in the range of about 4.5-10 microns. The photodetector, which can be formed on a semiconductor substrate as an nBn device, has a light absorbing region which includes InAsSb light-absorbing layers and tensile-strained layers interspersed between the InAsSb light-absorbing layers. The tensile-strained layers can be formed from GaAs, InAs, InGaAs or a combination of these III-V compound semiconductor materials. A barrier layer in the photodetector can be formed from AlAsSb or AlGaAsSb; and a contact layer in the photodetector can be formed from InAs, GaSb or InAsSb. The photodetector is useful as an individual device, or to form a focal plane array.

40 Claims, 5 Drawing Sheets

STRAIN-COMPENSATED INFRARED PHOTODETECTOR AND PHOTODETECTOR ARRAY

GOVERNMENT RIGHTS

This invention was made with Government support under Contract No. DE-AC04-94AL85000 awarded by the U.S. Department of Energy. The Government has certain rights in the invention.

STATEMENT OF JOINT RESEARCH AGREEMENT

The claimed invention was made as a result of activities undertaken within the scope of a Joint Research Agreement between Sandia Corporation and Lockheed Martin Corporation that was in effect before the date the claimed invention was made, and that was in effect at the time the claimed invention was made.

FIELD OF THE INVENTION

The present invention relates in general to infrared photodetectors, and in particular to infrared photodetectors with an nBn structure and an indium arsenide antimonide (InAsSb) light-absorbing layer.

BACKGROUND OF THE INVENTION

Midwave infrared (MWIR) photodetectors have recently been developed using an nBn structure which employs a barrier (B) to block the flow of majority carrier current while allowing the flow of minority carriers (see e.g. U.S. Pat. No. 7,687,871). Such nBn photodetectors, which employ a single light-absorbing layer of indium arsenide (InAs) have a long cutoff wavelength of 3.4 microns (μm) for the detection of MWIR light. The use of indium arsenide antimonide (InAsSb) for the light-absorbing layer allows the long cutoff wavelength to be extended to about 4.2 μm.

The present invention provides an advance in the art of nBn photodetectors by providing a plurality of InAsSb light-absorbing layers with tensile-strained layers interspersed therebetween. The tensile-strained layers can comprise gallium arsenide (GaAs), indium arsenide (InAs), indium gallium arsenide (InGaAs), or a combination of these III-V compound semiconductors. By providing the tensile-strained layers interspersed between the InAsSb light-absorbing layers according to the present invention, the amount of antimony in the InAsSb light-absorbing layers can be increased; and this allows the long cutoff wavelength to be increased beyond the present limit to 4.5-10 μm at a temperature of 160 K or less.

These and other advantages of the present invention will become evident to those skilled in the art.

SUMMARY OF THE INVENTION

The present invention relates to a photodetector which comprises a semiconductor substrate; a plurality of III-V compound semiconductor layers epitaxially grown on the semiconductor substrate including a plurality of indium arsenide antimonide (InAsSb) light-absorbing layers located above the semiconductor substrate, a plurality of tensile-strained layers interspersed between the plurality of InAsSb light-absorbing layers, a barrier layer located above the plurality of InAsSb light-absorbing layers, and a contact layer located above the barrier layer. Each tensile-strained layer can be selected from the group consisting of a gallium arsenide (GaAs) layer, an indium arsenide (InAs) layer, an indium gallium arsenide (InGaAs) layer and combinations thereof (e.g. a composite layer formed from one or more GaAs and InAs layers). The photodetector also includes a first electrode which is electrically connected to the plurality of InAsSb light-absorbing layers, and a second electrode which is electrically connected to the contact layer. The semiconductor substrate can be a gallium antimonide (GaSb) substrate, or alternately can be either a GaAs substrate or a silicon substrate.

The InAsSb light-absorbing layers can be in some cases stacked in an alternating arrangement with the tensile-strained layers, with one or more of the tensile-strained layers being located between each pair of the InAsSb light-absorbing layers. An alternating arrangement can also be used for a composite tensile-strained layer (e.g. using alternating GaAs and InAs layers, or with a GaAs layer being sandwiched between a pair of InAs layers).

Each InAsSb light-absorbing layer can comprise the III-V compound semiconductor alloy composition $InAs_xSb_{1-x}$ with $0 \leq X \leq 0.9$. By increasing the antimony content in the $InAs_xSb_{1-x}$, the long cutoff wavelength of the photodetector can be increased, with the long cutoff wavelength generally being in a range of 4.5 to 10 microns (μm) at a temperature of 160 K or less. A short cutoff wavelength of the photodetector can be about 3 microns or less.

Each InAsSb light-absorbing layer can be compressively strained and can have a layer thickness on the order of about 100 nanometers or less, with the layer thickness of each tensile-strained layer being about 50 nanometers or less. Altogether, 10-2000 InAsSb light-absorbing layers can be used in the photodetector of the present invention, with the total thickness of a light-absorbing region formed by the InAsSb light-absorbing layers and the tensile-strained layers being in the range of 1-10 microns. The exact layer thicknesses of the InAsSb light-absorbing layers and the tensile-strained layers can be selected so that the light-absorbing region has an average lattice constant which is substantially the same as the lattice constant of the semiconductor substrate (i.e. substantially lattice matched to the substrate).

The barrier layer can comprise either aluminum arsenide antimonide (AlAsSb) or aluminum gallium arsenide antimonide (AlGaAsSb). When the barrier layer comprises AlAsSb, the AlAsSb barrier layer can have the III-V compound semiconductor alloy composition $AlAs_xSb_{1-x}$ with x generally being in the range $0 \leq x \leq 0.2$, and with x being selected to provide a valence band energy which is substantially equal to the valence band energy of the InAsSb light-absorbing layers. When the barrier layer comprises AlGaAsSb, the barrier layer can have the III-V compound semiconductor alloy composition $Al_yGa_{1-y}As_xSb_{1-x}$ with $0.5 \leq y < 1$ and with $0 \leq x \leq 0.2$.

To define a lateral extent of the photodetector of the present invention, a portion of the contact layer, which can comprise InAs, GaSb or InAsSb, can be etched down to the barrier layer. In this way, single photodetectors and photodetector arrays can be formed according to the present invention.

The present invention also relates to a photodetector which comprises a semiconductor substrate; a light-absorbing region located above the semiconductor substrate, with the light-absorbing region comprising a plurality of alternating layers of InAsSb and GaAs; a barrier layer located above the light-absorbing region; and a contact layer located above the barrier layer. In the photodetector, a first electrode can be electrically connected to the light-absorbing region; and a second electrode can be electrically connected to the contact layer. The semiconductor substrate can be, for example, a GaSb substrate, a GaAs substrate, or a silicon substrate.

In the light-absorbing region, each InAsSb light-absorbing layer can comprise the III-V compound semiconductor alloy composition $InAs_XSb_{1-X}$ with $0 \leq X \leq 0.9$. The exact III-V compound semiconductor alloy composition of the InAsSb light-absorbing layers can be predetermined to provide a long cutoff wavelength for the detection of light which is in the range of 4.5 to 10 microns at a temperature of 160 K or less. Each GaAs layer in the light-absorbing region can have a thickness which is generally less than or equal to one-fifth of the thickness of an adjacent InAsSb layer. The light-absorbing region can have, for example, 10-2000 pairs of alternating layers of InAsSb and GaAs, with a total thickness of the light-absorbing region being, for example, in the range of 1-10 microns, and preferably about 5 microns when the infrared light to be detected has a wavelength of 5 microns.

In certain embodiments of the present invention, the light-absorbing region can further include a plurality of InAs layers. In these embodiments of the present invention, each InAs layer can either be sandwiched between one of the GaAs layers and one of the InAsSb layers, or alternately can be sandwiched between a pair of the InAsSb layers. The use of InAs layers in the light-absorbing region is useful to smooth the surface of this region during epitaxial growth.

The barrier layer in the photodetector can comprise AlAsSb or AlGaAsSb. The contact layer can comprise InAs, GaSb or InAsSb.

The present invention further relates to a photodetector which comprises a semiconductor substrate; a light-absorbing region located above the semiconductor substrate, with the light-absorbing region comprising a plurality of alternating layers of InAsSb and InGaAs; a barrier layer located above the light-absorbing region; a contact layer located above the barrier layer; a first electrode electrically connected to the light-absorbing region; and a second electrode electrically connected to the contact layer.

Each InAsSb light-absorbing layer in the light-absorbing region can comprise the III-V compound semiconductor alloy composition $InAs_XSb_{1-X}$ with $0 \leq X \leq 0.9$. This range of composition is useful to provide a long cutoff wavelength for the detection of light which is in the range of 4.5 to 10 microns at a temperature of 160 K or less. Each InGaAs layer in the light-absorbing region can have a thickness which is generally less than or equal to one-fifth of the thickness of an adjacent InAsSb layer. Altogether, the light-absorbing region can comprise 10 to 2000 pairs of alternating layers of InAsSb and InGaAs with a total thickness of the light-absorbing region being, for example, in the range of 1-10 microns.

The barrier layer can comprise AlAsSb or AlGaAsSb; and the contact layer can comprise InAs, GaSb or InAsSb. The semiconductor substrate can be a GaSb substrate, a GaAs substrate, or a silicon substrate.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
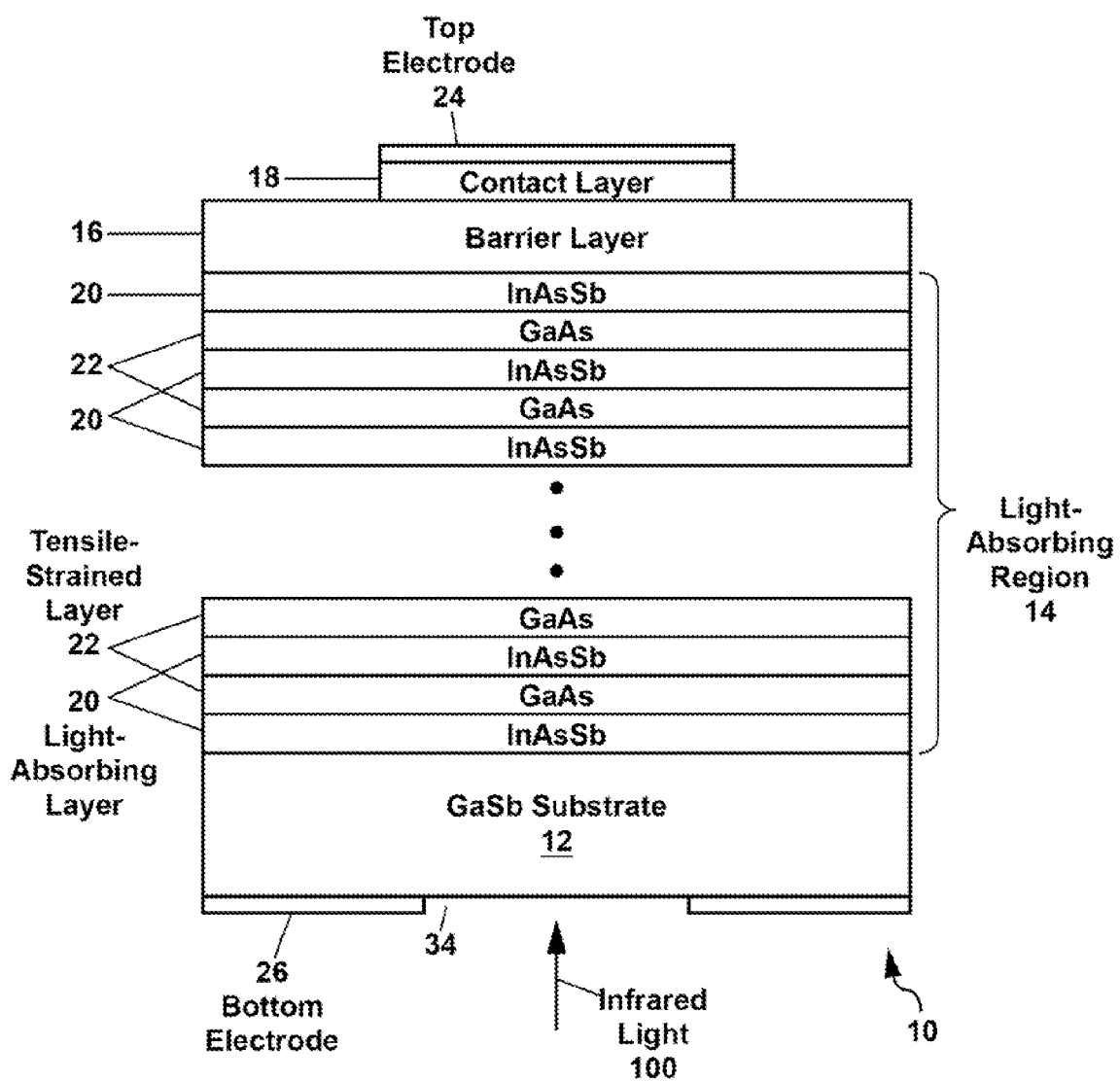
FIG. 1 shows a schematic cross-section view of a first example of a photodetector formed according to the present invention.

FIG. 1 shows a schematic cross-section view of a first example of a photodetector 10 of the present invention. In FIG. 1, the photodetector 10 comprises a semiconductor substrate 12 on which a plurality of III-V compound semiconductors are epitaxially grown to form a light-absorbing region 14, a barrier layer 16 and a contact layer 18. In FIG. 1, the light-absorbing region 14 comprises a plurality of indium arsenide antimonide (InAsSb) light-absorbing layers 20 and a plurality of tensile-strained layers 22 which are interspersed between the plurality of InAsSb light-absorbing layers 20. In the example of FIG. 1, the tensile-strained layers 22 comprise gallium arsenide (GaAs); whereas in other embodiments of the present invention, the tensile-strained layers 22 can comprise indium arsenide (InAs) or indium gallium arsenide (InGaAs). In some embodiments of the present invention as will be described in detail hereinafter, the tensile-strained layers 22 can comprise composite layers formed from a combination of layers of GaAs and InAs in an alternating arrangement (e.g. with a GaAs layer sandwiched between a pair of InAs layers). In yet other embodiments of the present invention, two different types of tensile-strained layers 22 can be used in the light-absorbing region 14.

In FIG. 1, the InAsSb light-absorbing layers 20 can each have a layer thickness which is, for example, about 10 nanometers (nm), with the GaAs tensile-strained layers 22 generally being less than or equal to one-fifth of the thickness of the InAsSb light-absorbing layers 20. As an example, the thickness of the GaAs tensile-strained layers 22 in FIG. 1 can be in the range of 0.15-0.5 nm thick.

The exact thickness of the tensile-strained layers 22, in general, will depend primarily upon an amount of tensile strain needed in these layers 22 to compensate for an amount of compressive strain in the InAsSb layers 20 which is needed to achieve a predetermined long cutoff wavelength for the photodetector 10. To a lesser extent, the thickness of the tensile-strained layers 22 will depend upon carrier conductivity considerations since the carriers (i.e. electrons and holes), which are photogenerated in the light-absorbing region 14 in response to absorbed infrared light 100, must be conducted across the tensile-strained layers 22 via tunneling and/or thermal excitation to generate an electrical output signal for the photodetector 10 since a bandgap energy of the tensile-strained layers 22 is larger than that of the InAsSb light-absorbing layers 20. Thus, in general, the layer thickness of the InAsSb light-absorbing layers 20 can be up to about 100 nm; and the layer thickness of the tensile-strained layers 22 can be up to about 50 nm, with the exact thickness of the tensile-strained layers 22 being dependent upon the III-V compound semiconductor material used to form these layers 22. As examples, when GaAs is used for the tensile-strained layers 22, the thickness of each layer will generally be $\leq 2$ nm, and when InAs is used for the tensile-strained layers 22, the thickness of each layer 22 will generally be much larger (e.g. up to about 50 nm) due to the much lower tensile strain and energy bandgap for InAs as compared to GaAs. When InGaAs is used for the tensile-strained layers 22, the thickness of each InGaAs tensile-strained layer 22 will be intermediate between the above thicknesses for the GaAs and InAs layers 22. As an example, when the InGaAs layers 22 have the semiconductor alloy composition $In_{0.5}Ga_{0.5}As$, the thickness of each InGaAs layer 22 can be $\leq 5$ nm.

To build up the light-absorbing region 14 during epitaxial growth of the InAsSb layers 20 and the GaAs layers 22 in the example of FIG. 1, a total of 200 alternating layers 20 and 22 can be used. This provides a total thickness for the light-absorbing region 14 which is about 1 μm. In other embodiments of the present invention, the number of the InAsSb light-absorbing layers 20 can range from 10 to 2000, with about the same number of tensile-strained layers 22 being used. The total thickness of the light-absorbing region 14 in these embodiments of the present invention can range from about 1-10 μm.

The III-V compound semiconductor layers which are used to form the photodetector 10 of FIG. 1 and the other examples of photodetectors 10 described hereinafter can be epitaxially grown on the semiconductor substrate 12 by molecular beam epitaxy (MBE). The semiconductor substrate 12 can comprise a gallium antimonide (GaSb) substrate, a gallium arsenide (GaAs) substrate or a silicon substrate. The semiconductor substrate 12 can be of a conventional size and thickness and can be procured commercially. The semiconductor substrate 12 can also be either undoped (i.e. not intentionally doped) or doped (e.g. n-type doped to about $10^{18}$ $cm^{-3}$).

In preparation for epitaxially growing the various III-V compound semiconductor layers 16, 18, 20 and 22 on the semiconductor substrate, a thin (e.g. 50 nm) buffer layer of the same semiconductor material as the substrate 12 can be initially grown on the substrate 12 to smooth out the surface of the substrate 12. This buffer layer is considered herein to be a part of the substrate 12 and, therefore, is not shown in FIG. 1.

In the discussion hereafter, a GaSb substrate 12 as shown in FIG. 1 will be used to illustrate epitaxial growth of the various III-V compound semiconductor layers 16, 18, 20 and 22 which are used to form the photodetector 10 of the present invention. In other embodiments of the present invention, these same III-V compound semiconductor layers can also be epitaxially grown on other types of semiconductor substrates 12 including a GaAs substrate 12 and a silicon substrate 12.

In FIG. 1, the plurality of III-V compound semiconductor layers can be epitaxially grown by MBE at a growth temperature in the range of 440-530° C. using solid sources. The InAsSb and GaAs layers 20 and 22, respectively, in the light-absorbing region 14 can be epitaxially grown as undoped layers which are not intentionally doped, but which, nevertheless, can have a small amount of residual n-type doping up to about $10^{16}$ $cm^{-3}$. Alternately, the layers 20 and 22 can be grown as doped layers with an n-type doping of, for example, $5 \times 10^{16}$ $cm^{-3}$.

The barrier layer 16, which is epitaxially grown above the light-absorbing region 14, can comprise an undoped (i.e. not intentionally doped) or doped (e.g. up to about $10^{17}$ $cm^{-3}$) layer of aluminum arsenide antimonide (AlAsSb) or aluminum gallium arsenide antimonide (AlGaAsSb) with a layer thickness of, for example, 100 nm. When AlAsSb is used for the barrier layer 16, the AlAsSb has the III-V compound semiconductor alloy composition $AlAs_xSb_{1-x}$ with x generally being in the range $0 \leq x \leq 0.2$ (e.g. $AlAs_{0.04}Sb_{0.96}$). When AlGaAsSb is used for the barrier layer 16, the AlGaAsSb has the III-V compound semiconductor alloy composition $Al_yGa_{1-y}As_xSb_{1-x}$ with $0.5 \leq y < 1$ and with $0 \leq x \leq 0.2$.

Ideally, the barrier layer 16 should be sufficiently thick to limit a tunneling of majority carriers (i.e. electrons) through barrier layer 16 and should also have a conduction band energy level which is sufficiently high compared to the conduction band energy level of the contact layer 18 to limit a thermal excitation of the majority carriers from the contact layer 18 over the barrier layer 16 at an operating temperature of the photodetector 10. Additionally, the semiconductor alloy composition of the barrier layer 16 will be selected to provide a valence band energy level which is substantially equal to the valence band energy level of the InAsSb light-absorbing layers 20. This allows minority carriers (i.e. holes), which are photogenerated in the light-absorbing region 14 as incident infrared light 100 is absorbed, to easily flow across the barrier layer 16 to the contact layer 18 and thereby contribute to the electrical output signal of the photodetector 10. Thus, as the amount of antimony in the InAsSb light-absorbing layers 20 is increased to shift the long cutoff wavelength of the photodetector 10 to a longer wavelength in the range of 4.5-10 μm, the semiconductor alloy composition of the barrier layer 16 can be adjusted to maintain a substantially zero offset between the valence band energy levels of the barrier layer 16 and the light-absorbing layers 20.

In the example of FIG. 1 and the other examples of the present invention to be discussed hereinafter, the barrier layer 16 also acts as a passivation layer to suppress surface currents due to the majority carriers. By suppressing surface currents and blocking a flow of the majority carriers from the contact layer 18 into the light-absorbing region 14, the barrier layer 16 substantially reduces a dark current in an electrical output signal of the photodetector 10.

In FIG. 1, the contact layer 18, which is epitaxially grown above the barrier layer 18, can comprise InAs, GaSb or InAsSb. A first-grown portion of the contact layer 18 can be undoped (i.e. not intentionally doped) with the remainder of the contact layer 18 being n-type doped (e.g. with silicon) during epitaxial growth. The n-type doping of the contact layer 18 can be increased to about $10^{18}$ $cm^{-2}$ in a last-grown portion of the contact layer 18. An overall thickness of the contact layer 18 can be, for example, 100 nm. With the InAsSb light-absorbing layers 20 and the contact layer 18 both being n-type doped, and with the barrier (B) layer being undoped, the photodetector 10 in FIG. 1 can be referred to as an nBn photodetector 10.

After epitaxial growth of the III-V compound semiconductor layers on the GaSb substrate 12 in FIG. 1, a top electrode 24 can be provided over the contact layer 18 using a photolithographically-defined mask layer (not shown) and lift-off. A contact metallization, which is used to form the top electrode 24, can be blanket deposited over the mask layer and in contact with an exposed portion of the contact layer 18 by evaporation or sputtering. The metallization, which is deposited onto the mask layer can then be lifted off with the mask layer to form the top electrode 24.

The top electrode 24, which can have an arbitrary shape (e.g. square, polygonal, or circular), can comprise any type of metallization known to the art for use with III-V compound semiconductor devices. As an example, the top electrode 24 can comprise a Ti/Pt/Au metallization formed by depositing 5 nm of titanium (Ti), 30 nm of platinum (Pt) and 100 nm of gold (Au) in that order. As another example, the top electrode 24 can comprise a Ge/Au/Ni/Au metallization formed by depositing 26 nm of germanium (Ge), 54 nm of gold, 15 nm of nickel (Ni) and 200 nm of gold in that order. At the same time the top electrode 24 is formed, an optional guard ring 30 (see FIG. 2) can be formed about the top electrode 24 using the same process steps which are used to form the top electrode 24.

Figure 2:
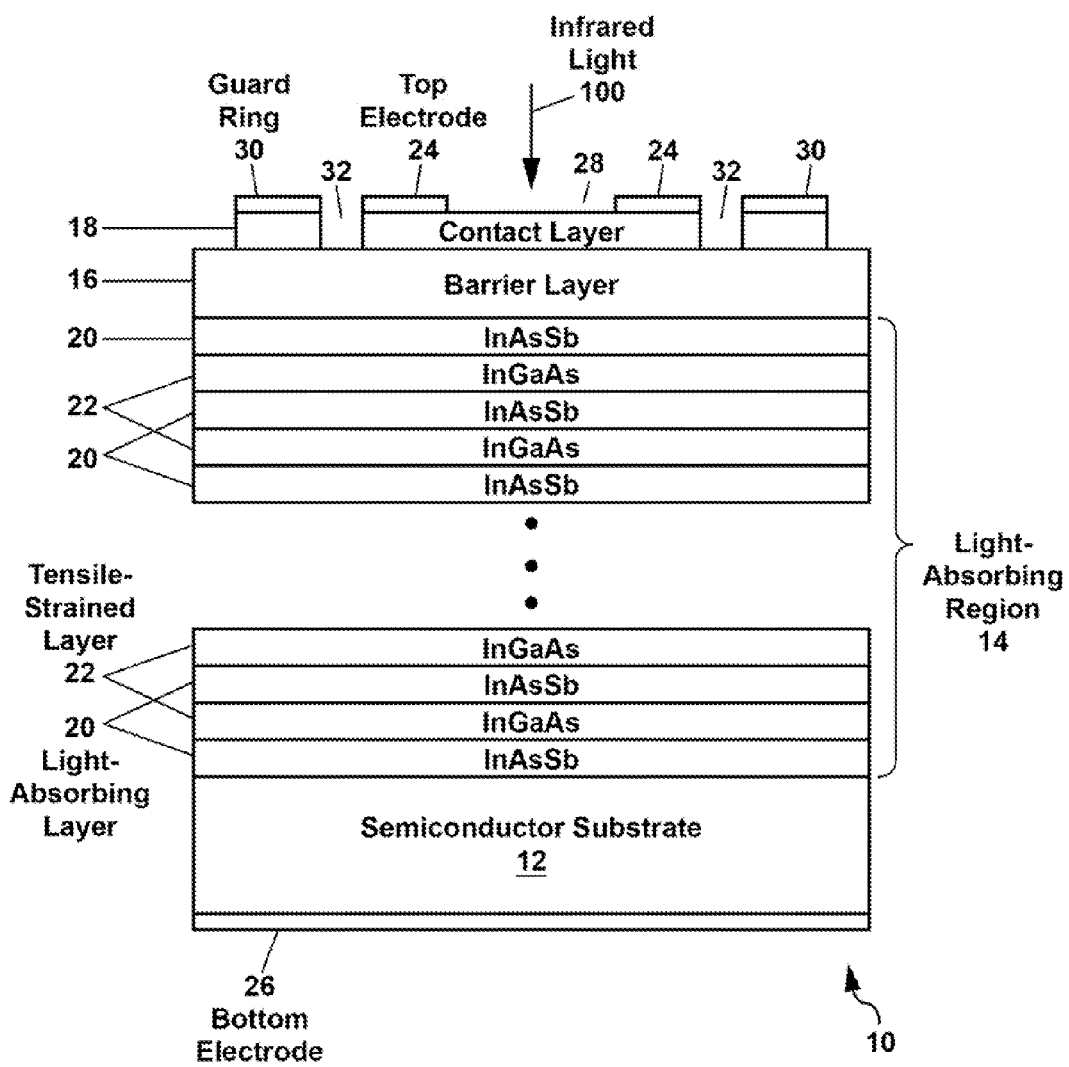
FIG. 2 shows a schematic cross-section view of a second example of a photodetector formed according to the present invention.

In the example of FIG. 1, the top electrode 24 covers the surface of the contact layer 18, and the infrared light 100 is directed into the light-absorbing region 14 through the substrate 12. In other embodiments of the present invention, the top electrode 24 can be formed with an annular shape to allow the light 100 to be incident into the light-absorbing region 14 from a top side of the substrate 12 (see FIG. 2). An annular top electrode 24 as shown in FIG. 2 can be used, for example, when the lateral extent of the top electrode 24 and underlying contact layer 18 are about 25 μm or larger.

After forming the top electrode 24 and the guard ring 30, if used, a photolithographically-defined etch mask (not shown) can be provided over the top side of the substrate 12 in preparation for etching down through a portion of the contact layer 18 to the barrier layer 16 to define a lateral extent (i.e. an active area size) of the photodetector 10. This etching step can be performed, for example, using a wet etchant comprising a solution of citric acid and hydrogen peroxide. This etching step can be timed and terminated upon reaching the barrier layer 16. The AlAsSb or AlGaAsSb used for the barrier layer 16 is not appreciably etched by the above etchant so that the barrier layer 16 acts as an etch stop for this etching step. For embodiments of the present invention which require additional etching through the barrier layer 16 down to the last-grown InAsSb light-absorbing layer 20 (see FIGS. 3 and 5), the barrier layer 16 can be etched using a dilute hydrofluoric acid etchant.

In the example of FIG. 1, the contact layer 18 outside of the lateral extent of the top electrode 24 can be removed down to the barrier layer 16 by the citric acid/hydrogen peroxide etching step. In other embodiments of the present invention wherein the guard ring 30 is provided about the top electrode 24 (see FIG. 2), an annular trench 32 can be formed between the guard ring 30 and the top electrode 24 during this same etching step. In yet other embodiments of the present invention wherein an array 50 of photodetectors 10 are formed on a common semiconductor substrate 12 (see FIG. 6), a plurality of straight trenches 32 can be etched down through the contact layer 18 to the barrier layer 16, with these straight trenches 32 intersecting to define the size and shape of each photodetector 10 in the array 50.

In the example of FIG. 1, a bottom electrode 26 can be deposited or sputtered over a bottom surface of the GaSb substrate 12 to provide an electrical connection through the substrate 12 to the light-absorbing region 14. The bottom electrode 26 can comprise a Ti/Pt/Au or Ge/Au/Ni/Au metallization as described previously. An opening 34 can be formed through the bottom electrode 26 as shown in FIG. 1 so that the infrared light 100 can be transmitted through the GaSb substrate 12 to the light-absorbing region 14. The opening 34 can be formed by providing a photolithographically-defined etch mask at the location of the opening 34 prior to depositing the metallization for the bottom electrode 26, and then the etch mask and the metallization deposited thereon can be lifted off. An anti-reflection coating 36 (see FIGS. 3 and 5) can be optionally provided over an exposed surface of the GaSb substrate 12 inside the opening 34 to reduce the reflection of the infrared light 100 at this surface of the substrate 12.

The photodetector 10 of FIG. 1 can be operated at a temperature of about 200 K or less with a small reverse-bias voltage (e.g. 0.01-0.25 Volts) applied between the electrodes 24 and 26. In response to incident infrared light 100, electrons and holes are photogenerated by the absorbed light 100 in the light-absorbing region 14. Under an electric field generated by the applied reverse-bias voltage, the photogenerated electrons flow to the bottom electrode 26 and are collected to contribute to the electrical output signal from the photodetector 10. The photogenerated holes move in an opposite direction and are collected in the contact layer 18 to further contribute to the electrical output signal of the photodetector 10. Electrical conduction of the photogenerated electrons and holes through the tensile-strained layers 22 can occur by tunneling and/or thermal excitation as previously described.

The barrier layer 16 has a valence band energy level which is about the same as that of the adjacent InAsSb light-absorbing layer 20 so that conduction of the photogenerated holes across the barrier layer 16 to the contact layer 18 is not impeded.

However, in the conduction band, there is a substantial offset (i.e. difference) between the conduction band energy level of the barrier layer 16 and the conduction band energy level of the contact layer 18. This substantial offset in the conduction band energy levels between these two layers 16 and 18 is effective to block any non-photogenerated electrons in the contact layer 18 from crossing the barrier layer 16 and entering the light-absorbing region 14 to produce a dark current in the photodetector 10. As a result, the photodetector 10 provides a greatly reduced dark current noise level in the electrical output signal from the photodetector 10. Surface currents, which can also contribute to the dark current in conventional photodetectors, are also reduced in the photodetector 10 of the present invention by the barrier layer 16 which acts as a passivation layer for the photodetector 10.

By providing the tensile-strained layers 22 in the light-absorbing region 14, the InAsSb light-absorbing layers 20 can be oppositely strained (i.e. compressively strained) by increasing the amount of antimony in the layers 20; and this compressive strain in the light-absorbing layers 20 can be accommodated. Increasing the amount of antimony in the InAsSb light-absorbing layers 20 is advantageous to increase a long cutoff wavelength for the detection of infrared light 100 in the photodetector 10. With the layers 20 and 22 being oppositely strained, an overall strain in the light-absorbing region 14 can be balanced and minimized when averaged over a number of the layers 20 and 22 so that an average lattice constant for the light-absorbing region 14 is about the same as the lattice constant of the semiconductor substrate 12. In this way, the light-absorbing region 14 can be substantially lattice-matched to the substrate 12. Thus, according to the present invention, the III-V semiconductor alloy composition of the InAsSb light-absorbing layers 20 can be $InAs_xSb_{1-x}$ with $0 \leq X \leq 0.9$ to provide a long cutoff wavelength for the photodetector 10 which is at a predetermined wavelength in the range of 4.5-10 μm at an operating temperature of, for example, 160 K or less.

As used herein, the term "long cutoff wavelength" refers to the wavelength on a long-wavelength side of a response curve of the photodetector 10 for which the response of the photodetector 10 is reduced by 50 percent from the photodetector's peak response. A short cutoff wavelength of the photodetector 10, for which the response of the photodetector 10 is reduced by 50 percent from the peak response on a short-wavelength side of the response curve of the photodetector, can be about 3 μm or less.

FIG. 2 shows a schematic cross-section view of a second example of the photodetector 10 of the present invention. In this example of the photodetector 10, each tensile-strained layer 22 in the light-absorbing region 14 comprises indium gallium arsenide (InGaAs). The III-V semiconductor alloy composition of the InGaAs in each tensile-strained layer 22 can be $In_xGa_{1-x}As$ with $0<x\leq1$. As an example, the tensile-strained layers 22 in FIG. 2 can be formed of $In_{0.5}Ga_{0.5}As$, with each InGaAs tensile-strained layer 22 having a layer thickness of 0.4 nm. In the example of FIG. 2, each InAsSb light-absorbing layer 20 in FIG. 2 can have a layer thickness of 10 nm. In other embodiments of the present invention, different layer thickness can be used for the InGaAs tensile-strained layers 22 and the InAsSb light-absorbing layers 20 as described previously.

The InGaAs layers 22 provide a tensile strain in the light-absorbing region 14; and this tensile strain allows the amount of antimony in the InAsSb light-absorbing layers 20 to be increased, thereby increasing the long cutoff wavelength for the photodetector 10. With the InGaAs tensile-strained layers 22 in the photodetector 10 of FIG. 2, the III-V semiconductor alloy composition of the InAsSb light-absorbing layers can be $InAs_xSb_{1-x}$ with $0\leq X\leq0.9$ to provide a long cutoff wavelength in the range of 4.5-10 μm at an operating temperature of, for example, 160 K or less.

In the example of FIG. 2, the total number of InAsSb layers 20 can be selected to provide an overall thickness of the light-absorbing region 14 in the range of 1-10 μm, and preferably about 5 μm for the detection of infrared light 100 at a wavelength of 5 μm. The barrier layer 16, as described previously, can comprise either AlAsSb or AlGaAsSb; and the contact layer 18 can comprise InAs, GaSb or InAsSb. Epitaxial growth of the III-V compound semiconductor layers 16, 18, 20 and 22 in the example of FIG. 2 can be performed as previously described by MBE at a growth temperature range of about 440-530° C. The semiconductor substrate 12 upon which the layers 16, 18, 20 and 22 are epitaxially grown can be a GaSb substrate, a GaAs substrate or a silicon substrate.

The photodetector 10 in the example of FIG. 2 is configured for entry of the infrared light 100 into the light-absorbing region 14 from a top side of the photodetector 10. This can be done by providing the top electrode 24 with an annular metallization (e.g. comprising Ti/Pt/Au or Ge/Au/Ni/Au) having an opening 28 therethrough. A guard ring 30 is provided about the top electrode 24, with the guard ring 30 being formed from a portion of the contact layer 18 and the same metallization which is used for the top electrode 24. In FIG. 2, a full-surface metallization (e.g. comprising Ti/Pt/Au or Ge/Au/Ni/Au) can be used for the bottom electrode 26.

The photodetector 10 of FIG. 2 functions in a manner similar to that of FIG. 1 with the light-absorbing region 14 absorbing the infrared light 100 to photogenerate electrons and holes. In response to a reverse-bias voltage of up to a few tenths of a Volt applied between the electrodes 24 and 26, the photogenerated electrons are urged to flow towards the bottom electrode 26, with the photogenerated holes being urged to flow in the opposite direction towards the top electrode 24. The valence energy levels of the InAsSb light-absorbing layers 20 are substantially aligned with the valence band energy level of the barrier layer 16 so that the photogenerated holes can freely flow across the barrier layer 16 to contribute to the electrical output signal of the photodetector 10. The flow of non-photogenerated electrons from the contact layer 18 into the light-absorbing region 14 is suppressed by the barrier layer 16 due to a large offset in the conduction band energy level of the barrier layer 16 as compared to that of the contact layer 18. As previously discussed, the barrier layer 16 also acts as a passivation layer to eliminate surface currents which could otherwise appear as dark current noise in the electrical output signal of the photodetector 10. With the above sources of noise reduced or eliminated in the photodetector 10 of the present invention, the signal-to-noise ratio (SNR) for the detection of the infrared light 100 can be increased.

Figure 3:
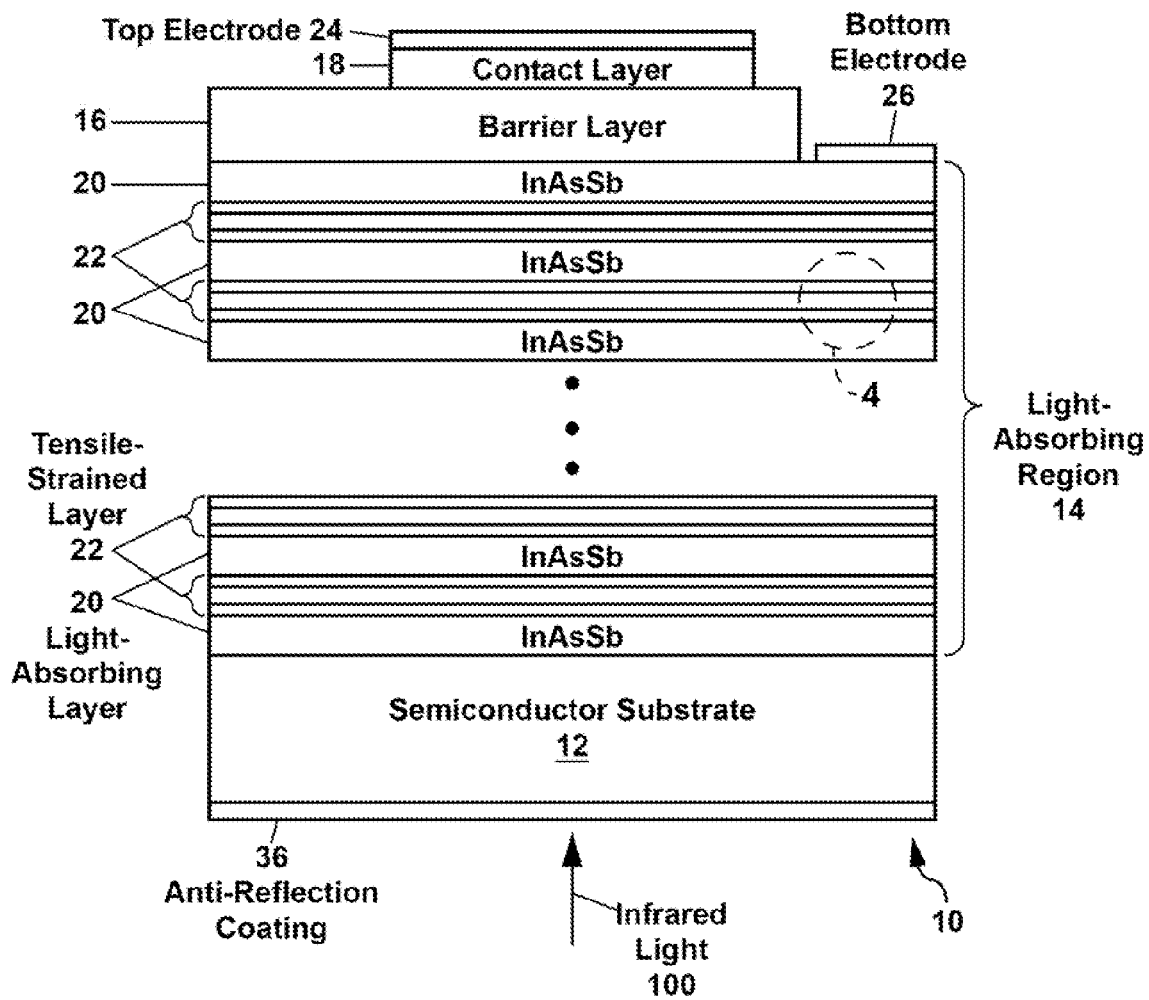
FIG. 3 shows a schematic cross-section view of a third example of a photodetector formed according to the present invention.

FIG. 3 shows a schematic cross-section view of a third example of the photodetector 10 of the present invention. In FIG. 3, each tensile-strained layer 22 is a composite layer formed from a plurality of different III-V compound semiconductor materials which are tensile strained. These different tensile-strained materials, which can be stacked in an alternating arrangement during epitaxial growth, can comprise, for example, GaAs and InAs as shown in the partial view of FIG. 4. In other embodiments of the present invention other combinations of different tensile-strained III-V compound semiconductor materials (e.g. GaAs and InGaAs, or InAs and InGaAs, or GaAs and InAs and InGaAs) can be used to form each composite tensile-strained layer 22.

Figure 4:
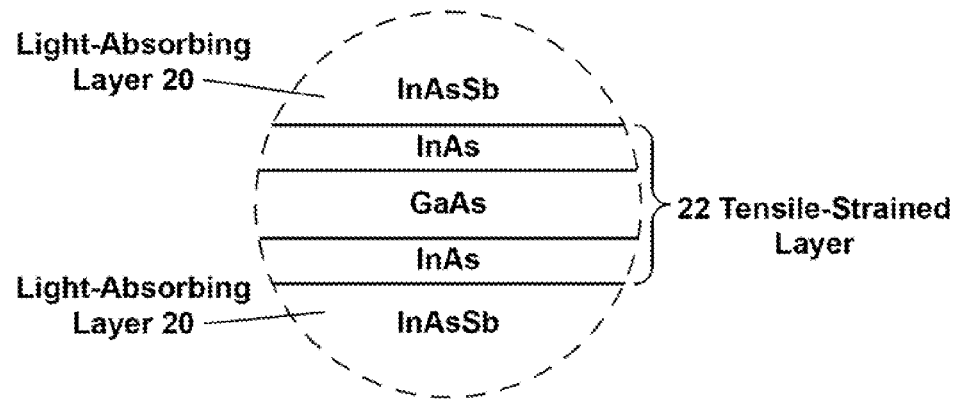
FIG. 4 shows a partial view of one of the composite tensile-strained layers in FIG. 3 which is formed from a GaAs layer sandwiched between a pair of InAs layers. The InAs layers separate the GaAs layer from adjacent InAsSb light-absorbing layers.

The various III-V compound semiconductor materials making up each composite tensile-strained layer 22 can be epitaxially grown by MBE, with an overall thickness of the composite layer 22 being sufficiently thin to allow conduction of photogenerated carriers (i.e. electrons and holes) through the layers 22. As an example, when the composite tensile-strained layer 22 has a sandwich structure as shown in FIG. 4 with a GaAs layer being sandwiched between a pair of InAs layers, the GaAs layer can have a layer thickness of, for example, 0.6 nm, and each InAs layer can have a layer thickness of, for example, 2.5 nm.

The use of composite tensile-strained layers 22 can alleviate surface and interface roughness in the light-absorbing region 14 during epitaxial growth of the light-absorbing region 14. By incorporating InAs layers into the tensile-strained layers 22 with the InAs layers being located between the GaAs layers and the InAsSb light-absorbing layers 20 as shown in FIG. 4, the surfaces of the various layers 20 and 2 in the light-absorbing region 14 can be smoothed during epitaxial growth. In other embodiments of the present invention, the ordering of the tensile-strained layers of InAs and GaAs and the compressively-strained InAsSb light-absorbing layers 20 can be different from that shown in FIG. 4. However, the effectiveness of the InAs layers in reducing surface and interface roughness can vary depending upon how these layers are ordered during epitaxial growth of the light-absorbing region 14. In the example of FIGS. 3 and 4, which uses a plurality of composite tensile-strained layers 22, the surface and interface roughness can be minimized when each GaAs layer is sandwiched between a pair of InAs layers as shown in FIG. 4.

In other embodiments of the present invention when GaAs is used alone for the tensile-strained layers 22, the surface of the light-absorbing region 14 during epitaxial growth and the interfaces between the GaAs tensile-strained layers 22 and the InAsSb light-absorbing layers 20 can be smoothed by alternating the gallium (Ga) and arsenic (As) fluxes during the MBE growth of the GaAs layers 22. This can increase the mobility of the Ga and As atoms, thereby smoothing the surface of the GaAs layers 22 during epitaxial growth.

In the example of FIG. 3, the contact layer 18 can be etched down to the barrier layer 16 to define an active-area size for the photodetector 10. Additionally, a portion of the barrier layer 16 can be etched down to the light-absorbing region 14 to allow the bottom electrode 26 to be deposited onto the light-absorbing region 14 (e.g. onto a last-grown InAsSb layer 20). As previously discussed, etching of the contact layer 18 can be performed using a citric acid/hydrogen peroxide etchant; and etching of the barrier layer 16 can be performed using a dilute hydrofluoric acid etchant. The electrode arrangement of FIG. 3 allows the infrared light 100 to be transmitted through the semiconductor substrate 12 to the light-absorbing region 14, and also allows each electrode 24 and 26 to be located on the same side of the substrate 12 so that the photodetector 10 can be mated to a readout integrated circuit (ROIC) using solder bump bonds to make the electrical connections between the photodetector 10 and the ROIC. This electrode arrangement is also useful when an array 50 of photodetectors 10 are to be formed as shown in the schematic plan view of FIG. 6.

Figure 5:
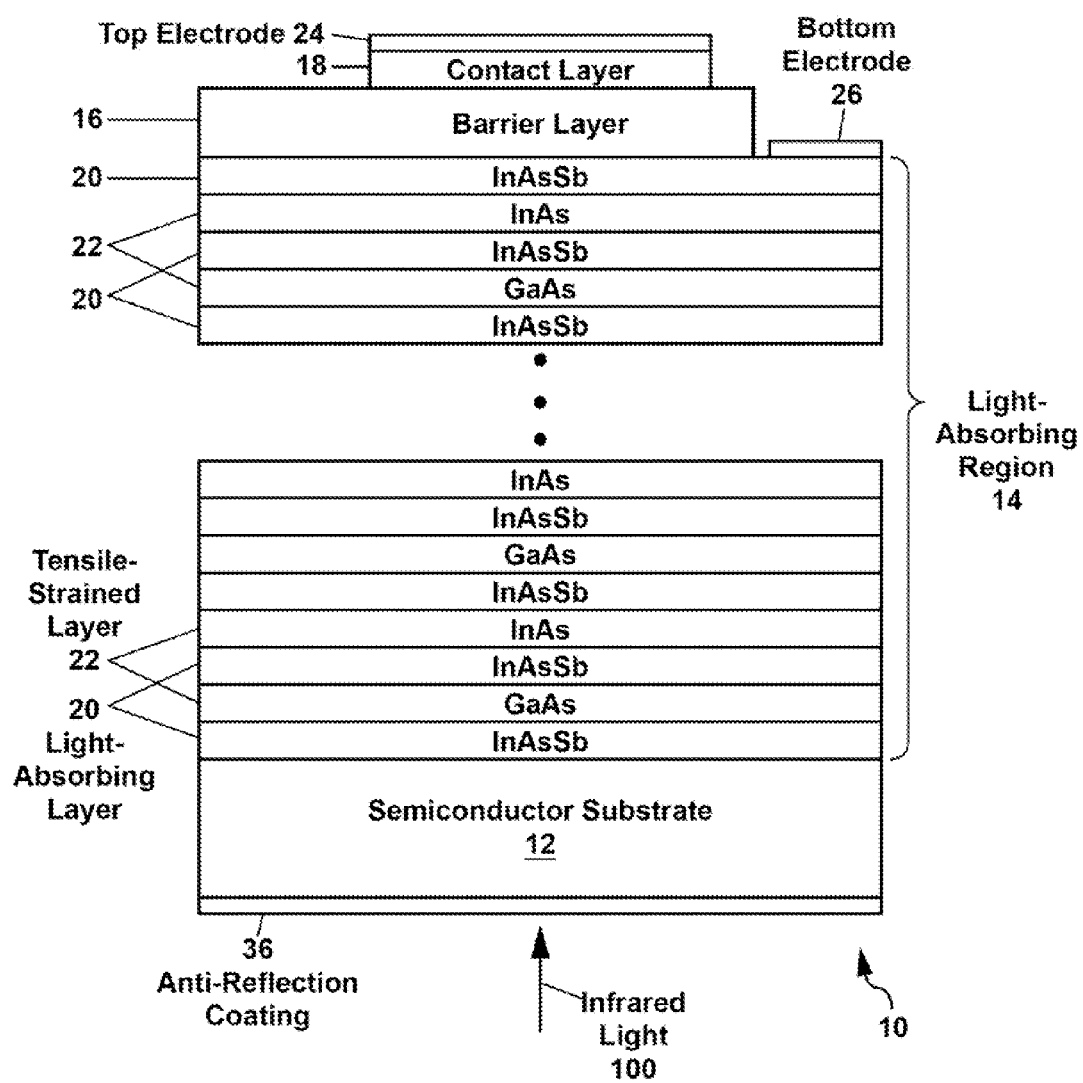
FIG. 5 shows a schematic cross-section view of a fourth example of the photodetector 10 of the present invention

FIG. 5 shows a schematic cross-section view of a fourth example of the photodetector 10 of the present invention. In this fourth example of the photodetector 10, the light-absorbing region 14 includes tensile-strained layers 22 of two different III-V compound semiconductor alloy compositions with the InAsSb light-absorbing layers 20 being located therebetween in an alternating arrangement. By alternating InAs tensile-strained layers 22 with GaAs tensile-strained layers 22 in the example of FIG. 5, the surface and interface roughness can be alleviated during epitaxial growth of the light-absorbing region 14. The InAs tensile-strained layers 22 in FIG. 5 serve to smooth the surface of the light-absorbing region 14 during epitaxial growth by MBE. With a smoother surface of the layers 20 and 22 in the light-absorbing region 14, the quantum efficiency of the photodetector 10 can be increased. Additionally, a smoother surface of the layers 20 and 22 allows a larger number (e.g. up to about 2000) of these layers 20 and 22 to be provided in the light-absorbing region 14 and also allows a larger overall thickness (e.g. up to about 10 μm) of the light-absorbing region 14 in the photodetector 10. Those skilled in the art will understand that other arrangements of tensile-strained layers 22 of different III-V compound semiconductor alloy compositions are possible according to the present invention.

Figure 6:
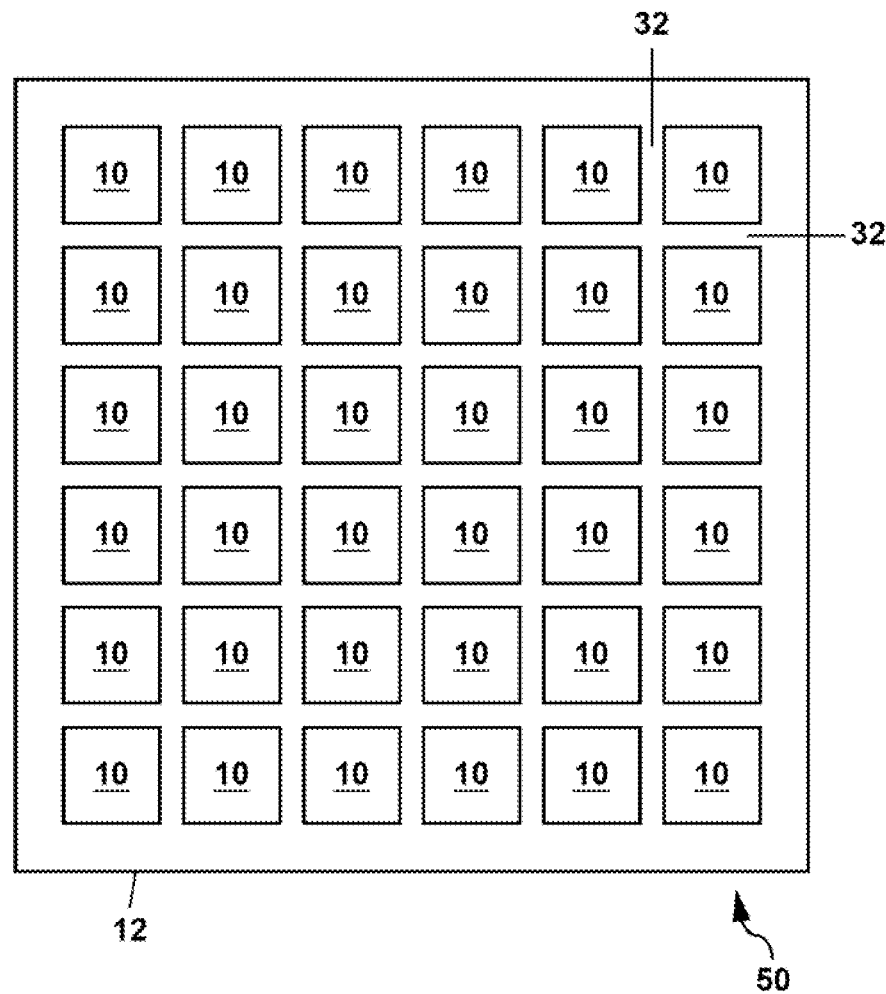
FIG. 6 shows a schematic plan view of a fifth example of the present invention in the form of a focal plane array comprising a plurality of photodetectors located on a common semiconductor substrate.

FIG. 6 schematically illustrates in plan view a fifth example of the present invention. In this example, a plurality of photodetectors 10 are formed on a common semiconductor substrate 12 as a photodetector array 50 (also termed a focal plane array). Although only a few photodetectors 10 are shown the focal plane array 50 in FIG. 6, those skilled in the art know that a large number of thousands to millions of individual photodetectors 10 can be provided in such an array 50, with the lateral dimensions of each photodetector 10 being, for example, 5-10 μm. Each photodetector 10 in the focal plane array 50 of FIG. 6 can be formed according to any of the examples described herein with reference to FIGS. 1-5. The bottom electrode 26 can serve as a common electrode for all of the photodetectors 10 in the focal plane array 50, and the top electrodes 24 can be individually connected to a ROIC (e.g. using solder bump bonds) to process the electrical output signals from each photodetector 10. The focal plane array 50 of FIG. 6 has applications for imaging using infrared light 100 having a wavelength in the range of about 3-10 μm.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A photodetector, comprising:
   a semiconductor substrate;
   a plurality of III-V compound semiconductor layers epitaxially grown on the semiconductor substrate including:
      a plurality of indium arsenide antimonide (InAsSb) light-absorbing layers located above the semiconductor substrate;
      a plurality of tensile-strained layers interspersed between the plurality of InAsSb light-absorbing layers, the plurality of tensile-strained layers comprising layers of indium arsenide (InAs) or indium gallium arsenide (InGaAs);
      a barrier layer located above the plurality of InAsSb light-absorbing layers;
      an contact layer located above the barrier layer;
   a first electrode electrically connected to the plurality of InAsSb light-absorbing layers; and
   a second electrode electrically connected to the contact layer.

2. The photodetector of claim 1 wherein the InAsSb light-absorbing layers are stacked in an alternating arrangement with the tensile-strained layers, with at least one of the tensile-strained layers being located between each pair of the InAsSb light-absorbing layers.

3. The photodetector of claim 1 wherein the plurality of tensile-strained layers further comprise layers of gallium arsenide (GaAs).

4. The photodetector of claim 3 wherein the GaAs layers are alternated with the InAs layers, with one of the InAsSb light-absorbing layers being located between each adjacent pair of the GaAs and InAs layers.

5. The photodetector of claim 3 wherein the plurality of tensile-strained layers are composite layers, with each composite layer being formed from at least one of the GaAs layers and at least one of the InAs layers.

6. The photodetector of claim 5 wherein the at least one GaAs layer and the at least one InAs layer are stacked in an alternating arrangement.

7. The photodetector of claim 5 wherein each GaAs layer is sandwiched between a pair of the InAs layers.

8. The photodetector of claim 1 wherein each InAsSb light-absorbing layer comprises $InAs_xSb_{1-x}$ with $0 < X \leq 0.9$.

9. The photodetector of claim 8 wherein each InAsSb light-absorbing layer has a layer thickness of about 100 nanometers or less.

10. The photodetector of claim 1 wherein each tensile-strained layer has a layer thickness of 50 nanometers or less.

11. The photodetector of claim 1 wherein a long cutoff wavelength for the detection of light is in a range of 4.5 to 10 microns at a temperature of 160° K or less.

12. The photodetector of claim 1 wherein the barrier layer has a semiconductor alloy composition $AlAs_xSb_{1-x}$ with x being selected to provide a valence band energy which is substantially equal to the valence band energy of the plurality of InAsSb light-absorbing layers.

13. The photodetector of claim 1 wherein the barrier layer comprises aluminum gallium arsenide antimonide (AlGaAsSb).

14. The photodetector of claim 13 wherein the AlGaAsSb barrier layer has a semiconductor alloy composition $Al_yGa_{1-y}As_xSb_{1-x}$ with $0.5 \leq y \leq 1$ and with $0 \leq x \leq 0.2$.

15. The photodetector of claim 1 wherein the plurality of InAsSb light-absorbing layers comprises 10 to 2000 InAsSb light-absorbing layers.

16. The photodetector of claim 1 wherein the plurality of InAsSb light-absorbing layers and the plurality of tensile-strained layers have a total thickness in the range of 1-10 microns.

17. The photodetector of claim 1 wherein each InAsSb light-absorbing layer is compressively strained.

18. The photodetector of claim 1 wherein a portion of the contact layer is etched down to the barrier layer to define a lateral extent of the photodetector.

19. The photodetector of claim 1 wherein the semiconductor substrate comprises a gallium antimonide (GaSb) substrate.

20. A photodetector, comprising:
a semiconductor substrate;
a light-absorbing region located above the semiconductor substrate, with the light-absorbing region comprising a plurality of layers of indium arsenide antimonide (InAsSb), gallium arsenide (GaAs) and indium arsenide (InAs);
a barrier layer located above the light-absorbing region;
a contact layer located above the barrier layer;
a first electrode electrically connected to the light-absorbing region; and
a second electrode electrically connected to the contact layer.

21. The photodetector of claim 20 wherein each InAsSb light-absorbing layer comprises $InAs_xSb_{1-x}$ with $0<x\leq0.9$.

22. The photodetector of claim 20 wherein each GaAs layer has a thickness which is less than or equal to one-fifth of the thickness of an adjacent InAsSb layer.

23. The photodetector of claim 20 wherein the light-absorbing region has a total thickness in the range of 1-10 microns.

24. The photodetector of claim 20 wherein a long cutoff wavelength for the detection of light is in the range of 4.5 to 10 microns at a temperature of 160° K or less.

25. The photodetector of claim 20 wherein the light-absorbing region comprises 10 to 2000 InAsSb layers.

26. The photodetector of claim 20 wherein each InAs layer is sandwiched between one of the GaAs layers and one of the InAsSb layers.

27. The photodetector of claim 20 wherein each InAs layer is sandwiched between a pair of the InAsSb layers.

28. The photodetector of claim 20 wherein the barrier layer comprises aluminum arsenide antimonide (AlAsSb).

29. The photodetector of claim 20 wherein the barrier layer comprises aluminum gallium arsenide antimonide (AlGaAsSb).

30. The photodetector of claim 20 wherein the contact layer comprises a III-V compound semiconductor material selected from the group consisting of indium arsenide (InAs), gallium antimonide (GaSb) and indium arsenide antimonide (InAsSb).

31. The photodetector of claim 20 wherein the semiconductor substrate is selected from the group consisting of a gallium antimonide (GaSb) substrate, a gallium arsenide (GaAs) substrate, and a silicon substrate.

32. A photodetector, comprising:
a semiconductor substrate;
a light-absorbing region located above the semiconductor substrate, with the light-absorbing region comprising a plurality of alternating layers of indium arsenide antimonide (InAsSb) and indium gallium arsenide (InGaAs);
a barrier layer located above the light-absorbing region;
a contact layer located above the barrier layer;
a first electrode electrically connected to the light-absorbing region; and
a second electrode electrically connected to the contact layer.

33. The photodetector of claim 32 wherein each InAsSb light-absorbing layer comprises $InAs_xSb_{1-x}$ with $0<x\leq0.9$.

34. The photodetector of claim 32 wherein each InGaAs layer has a thickness which is less than or equal to one-fifth of the thickness of an adjacent InAsSb layer.

35. The photodetector of claim 32 wherein the light-absorbing region has a total thickness in the range of 1-10 microns.

36. The photodetector of claim 32 wherein a long cutoff wavelength for the detection of light is in the range of 4.5 to 10 microns at a temperature of 160° K or less.

37. The photodetector of claim 32 wherein the light-absorbing region comprises 10 to 2000 pairs of alternating layers of InAsSb and InGaAs.

38. The photodetector of claim 32 wherein the barrier layer comprises aluminum arsenide antimonide (AlAsSb) or aluminum gallium arsenide antimonide (AlGaAsSb).

39. The photodetector of claim 32 wherein the contact layer is selected from the group consisting of an indium arsenide (InAs) contact layer, a gallium antimonide (GaSb) contact layer, and an indium arsenide antimonide (InAsSb) contact layer.

40. The photodetector of claim 32 wherein the semiconductor substrate is selected from the group consisting of a gallium antimonide (GaSb) substrate, a gallium arsenide (GaAs) substrate, and a silicon substrate.

* * * * *